United States Patent
Kwon et al.

(10) Patent No.: US 10,931,083 B2
(45) Date of Patent: Feb. 23, 2021

(54) OPTICAL APPARATUS INCLUDING A COOLING DEVICE AND A GAP

(71) Applicant: ELECTRONICS AND TELECOMMUNICATIONS RESEARCH INSTITUTE, Daejeon (KR)

(72) Inventors: Oh Kee Kwon, Daejeon (KR); Su Hwan Oh, Daejeon (KR); Chul-Wook Lee, Daejeon (KR); Kisoo Kim, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 10 days.

(21) Appl. No.: 16/585,035

(22) Filed: Sep. 27, 2019

(65) Prior Publication Data

US 2020/0028324 A1   Jan. 23, 2020

Related U.S. Application Data

(62) Division of application No. 15/702,262, filed on Sep. 12, 2017, now Pat. No. 10,476,232.

(30) Foreign Application Priority Data

Jan. 13, 2017   (KR) .......................... 10-2017-0006421

(51) Int. Cl.
*H01S 5/125*   (2006.01)
*H01S 5/024*   (2006.01)
(Continued)

(52) U.S. Cl.
CPC .............. *H01S 5/125* (2013.01); *H01S 5/026* (2013.01); *H01S 5/02453* (2013.01);
(Continued)

(58) Field of Classification Search
CPC ........ H01S 5/06; H01S 5/0612; H01S 5/0804; H01S 5/06256; H01S 5/125;
(Continued)

(56) References Cited

U.S. PATENT DOCUMENTS

| 4,952,019 A | * | 8/1990 | Evans | H01L 33/0045 |
| | | | | 257/94 |
| 6,049,638 A | * | 4/2000 | Norimatsu | G02B 6/4214 |
| | | | | 257/E31.038 |

(Continued)

FOREIGN PATENT DOCUMENTS

| JP | 09-074250 | * | 3/1997 | ............... H01S 5/00 |
| JP | H0974250 A | | 3/1997 | |

OTHER PUBLICATIONS

Brian R. Bennett et al., "Carrier-Induced Change in Refractive Index of InP, GaAs, and InGaAsP", IEEE Journal of Quantum Electronics, vol. 26, No. 1, pp. 113-122, Jan. 1990.

(Continued)

*Primary Examiner* — Matthew C Landau
*Assistant Examiner* — Eric K Ashbahian
(74) *Attorney, Agent, or Firm* — Rabin & Berdo, P.C.

(57) ABSTRACT

An optical apparatus includes a cooling device with a lower clad disposed thereon; a waveguide disposed on the lower clad and including an active waveguide to define a gain section and a passive waveguide to define a wavelength-tunable section; gratings disposed in the lower clad of the wavelength-tunable section; an upper clad disposed on the waveguide; a first upper electrode disposed on the upper clad of the gain section; and a second upper electrode disposed on the upper clad of the wavelength-tunable section. The lower clad of the wavelength-tunable section has a recess region to expose an upper surface of the cooling device, the recess region forming an air gap-having a height of 10 μm to 80 μm from the upper surface of the cooling (Continued)

device. The gratings are formed in a depth of at least 5 μm from a bottom surface of the lower clad of the recess region.

3 Claims, 14 Drawing Sheets (51) Int. Cl.
*H01S 5/026* (2006.01)
*H01S 5/12* (2021.01)
*H01S 5/065* (2006.01)
*H01S 5/0625* (2006.01)
*H01S 5/06* (2006.01)
*H01S 5/02* (2006.01)
*H01S 5/042* (2006.01)

(52) U.S. Cl.
CPC ...... *H01S 5/02461* (2013.01); *H01S 5/02469* (2013.01); *H01S 5/0651* (2013.01); *H01S 5/06256* (2013.01); *H01S 5/1234* (2013.01); H01S 5/0207 (2013.01); H01S 5/02415 (2013.01); H01S 5/04256 (2019.08); H01S 5/0612 (2013.01)

(58) Field of Classification Search
CPC .......... H01S 5/06258; H01S 5/187; H01S 5/10–187; H01S 5/00–0288; G02B 2006/12107; G01N 2021/399; G02F 1/3775; G02F 2201/302
See application file for complete search history.

(56) References Cited

U.S. PATENT DOCUMENTS

| | | | |
|---|---|---|---|
| 7,224,708 B2 | 5/2007 | Sin et al. | |
| 7,486,709 B2 | 2/2009 | Hu et al. | |
| 2003/0006225 A1 | 1/2003 | Choa | |
| 2007/0096042 A1* | 5/2007 | Velez | G01C 19/72 250/504 R |
| 2008/0068842 A1* | 3/2008 | Dekker | H05K 1/0204 362/294 |
| 2010/0092175 A1 | 4/2010 | Kim et al. | |
| 2010/0177793 A1* | 7/2010 | Rossi | H01S 5/141 372/20 |
| 2010/0311195 A1 | 12/2010 | Matsui et al. | |
| 2011/0090932 A1 | 4/2011 | Park et al. | |
| 2013/0114242 A1 | 5/2013 | Pickard et al. | |
| 2014/0321488 A1 | 10/2014 | Chen et al. | |
| 2014/0376575 A1 | 12/2014 | Kono et al. | |
| 2015/0288140 A1 | 10/2015 | Davies et al. | |
| 2016/0064897 A1* | 3/2016 | Higa | H01S 5/06258 372/50.11 |
| 2016/0071963 A1 | 3/2016 | Chan et al. | |
| 2017/0051884 A1 | 2/2017 | Raring et al. | |
| 2017/0125640 A1 | 5/2017 | Kim et al. | |
| 2017/0237226 A1* | 8/2017 | Johnson | H01S 5/0683 385/2 |

OTHER PUBLICATIONS

S. L. Woodward et al., "A DBR Laser Tunable by Resistive Heating", IEEE Photonics Technology Letters, vol. 4, No. 12, pp. 1330-1332, Dec. 1992.
S. Wang, "Principles of Distributed Feedback and Distributed Bragg-Reflector Lasers", IEEE Journal of Quantum Electronics, vol. 10, No. 4, pp. 413-427, Apr. 1974.
T. L. Koch et al., "Continuously Tunable 1.5 μm Multiple-Quantum-Well GaInAs/GaInAsP Distributed-Bragg-Reflector Lasers", Electronics Letters, vol. 24, No. 23, pp. 1431-1433, Nov. 10, 1988.
Ximeng Han et al., "Numerical Analysis on Thermal Tuning Efficiency and Thermal Stress of a Thermally Tunable SG-DBR Laser", IEEE Photonics Journal, vol. 8, No. 3, Jun. 2016.

* cited by examiner

OPTICAL APPARATUS INCLUDING A COOLING DEVICE AND A GAP

CROSS-REFERENCE TO RELATED APPLICATIONS

This application is a division of U.S. application Ser. No. 15/702,262, filed on Sep. 12, 2017 (allowed on Jul. 3, 2019). Furthermore, this application claims priority under 35 U.S.C. § 119 of Korean Patent Application No. 10-2017-0006421, filed on Jan. 13, 2017, and the entire disclosures of the prior U.S. and Korean applications are incorporated herein by reference.

BACKGROUND

The present disclosure herein relates to an optical apparatus and a manufacturing method thereof, and more particularly, to an optical apparatus including a distributed Bragg reflector laser diode and a manufacturing method thereof.

A typical distributed Bragg reflector (DBR) laser diode may be a longitudinal single-mode light source and a wavelength tunable laser. The typical DBR laser diode may include a gain section and a DBR section. The gain section and the DBR section may be monolithically integrated in a waveguide type in a semiconductor substrate.

SUMMARY

An exemplary embodiment provides a manufacturing method of a distributed Bragg reflector laser diode in which a recess region may be easily provided.

An exemplary embodiment also provides a manufacturing method of an optical apparatus capable of minimizing a heating and cooling interference.

An embodiment of the inventive concept provides an optical apparatus including: a cooling device; a distributed Bragg reflector laser diode having a lower clad including a recess region on one side of the cooling device and connected to another side of the cooling device; and an air gap between the cooling device and the distributed Bragg reflector laser diode. Here, the air gap is defined by a bottom surface of the lower clad in the recess region and a top surface of the cooling device.

In an embodiment, the distributed Bragg reflector laser diode may include: a waveguide including a passive waveguide on one side of the lower clad and an active waveguide on another end of the lower clad; an upper clad on the waveguide; a first upper electrode on the upper clad of the active waveguide; and a second upper electrode on the upper clad of the passive waveguide. The recess region may be disposed below the second upper electrode.

In an embodiment, the distributed Bragg reflector laser diode may further include gratings disposed in the lower clad below the second upper electrode. The gratings may be disposed in a depth equal to or greater than 5 μm from the bottom surface of the lower clad in the recess region.

In an embodiment, the optical apparatus may further include bumps between the lower clad and the other side of the cooling device. The cooling device may include a thermocouple; and a metal optical bench between the thermocouple and the bumps.

In an embodiment, the optical apparatus may further include bumps between the lower clad and the other side of the cooling device. The cooling device may include a thermocouple; a mount block between the thermocouple and the bumps; and a metal pattern formed between the mount block and the bumps the metal pattern grounded.

In an embodiment of the inventive concept, a manufacturing method of a distributed Bragg reflector laser diode includes: forming gratings in a lower clad; forming a waveguide including a passive waveguide on the gratings and an active waveguide connected to the passive waveguide; forming an upper clad on the waveguide; forming a plurality of upper electrodes on the upper clad; forming a lower electrode layer below the lower clad; and etching a part of the lower electrode layer below the gratings and a part of the lower clad to form a lower electrode and a recess region.

In an embodiment, when a thickness of the lower clad is 100 μm, the lower clad may be etched to 80 μm or thinner, and the gratings may be formed in a depth equal to or greater than 5 μm from a bottom surface of the lower clad in the recess region.

In an embodiment, the manufacturing method may further include: forming an insulation layer between one of upper electrodes and the upper clad, wherein when the insulation layer has a thickness of 100 nm, the recess region is formed in a depth of 45 μm.

In an embodiment, the lower clad may be etched to have a thickness equal to or greater than 3 μm between a bottom surface of the gratings and a bottom surface of the lower clad in the recess region.

In an embodiment, the recess region may include trenches formed in a line shape.

In an embodiment, the recess region may include holes arranged in a honeycomb shape.

In an embodiment, the upper electrodes may include: a first upper electrode on the active waveguide; a second upper electrode adjacent to the first upper electrode and formed on the passive waveguide; and a third upper electrode adjacent to the second upper electrode and formed on the passive waveguide, wherein the third upper electrode is used as a heater electrode configured to heat the passive waveguide.

In an embodiment, the manufacturing method of claim may further include: forming first and second Ohmic contact layers between the upper clad and the first and second electrodes.

In an embodiment, the manufacturing method may further include: providing first to third pads on the first to third upper electrodes, wherein the first and second Ohmic contact layers, the first and second upper layers, and the first and second pads are provided in a laminated structure of titanium/platinum/gold.

In an embodiment, the third upper layer and the third pad may respectively include chromium and gold.

In an embodiment of the inventive concept, a manufacturing method of an optical apparatus includes: forming a distributed Bragg reflector laser diode; forming bumps below the distributed Bragg reflector laser diode; bonding a cooling device to the bumps, wherein a manufacturing method of the distributed Bragg reflector laser diode includes: forming gratings in a lower clad; forming a waveguide including a passive waveguide on the gratings and an active waveguide connected to the passive waveguide; forming an upper clad on the waveguide; forming a plurality of upper electrodes on the upper clad; forming a lower electrode layer below the lower clad; and etching a part of the lower electrode layer below the gratings and a part of the lower clad to provide a lower electrode and a recess region.

In an embodiment, the lower clad below the passive waveguide and the cooling device may form an air gap, wherein the air gap may be formed larger than a depth of a bottom surface of the lower clad in the recess region.

In an embodiment, the cooling device may include: a thermocouple; and a metal optical bench between the thermocouple and the bumps.

In an embodiment, the cooling device may include: a thermocouple;

a mount block between the thermocouple and the bumps; and a metal pattern formed and earthed between the mount block and the bumps.

In an embodiment, the mount block may include ceramic.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, specific embodiments will be described in detail with reference to the accompanying drawings. Advantages and features of the present invention, and methods for achieving the same will be cleared with reference to exemplary embodiments described later in detail together with the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The present invention is defined by only scopes of the claims. Throughout this specification, like numerals refer to like elements.

The terms and words used in the following description and claims are to describe embodiments but are not limited the inventive concept. As used herein, the singular forms "a," "an" and "the" are intended to include the plural forms as well, unless the context clearly indicates otherwise. It will be further understood that the terms "comprises" and/or "comprising" used herein specify the presence of stated components, operations and/or elements but do not preclude the presence or addition of one or more other components, operations and/or elements. In addition, a solder, blocks, powders, a spacer, and a magnetic field may be understood as mainly used meanings. In addition, as just exemplary embodiments, reference numerals shown according to an order of description are not limited to the order.

Figure 1:
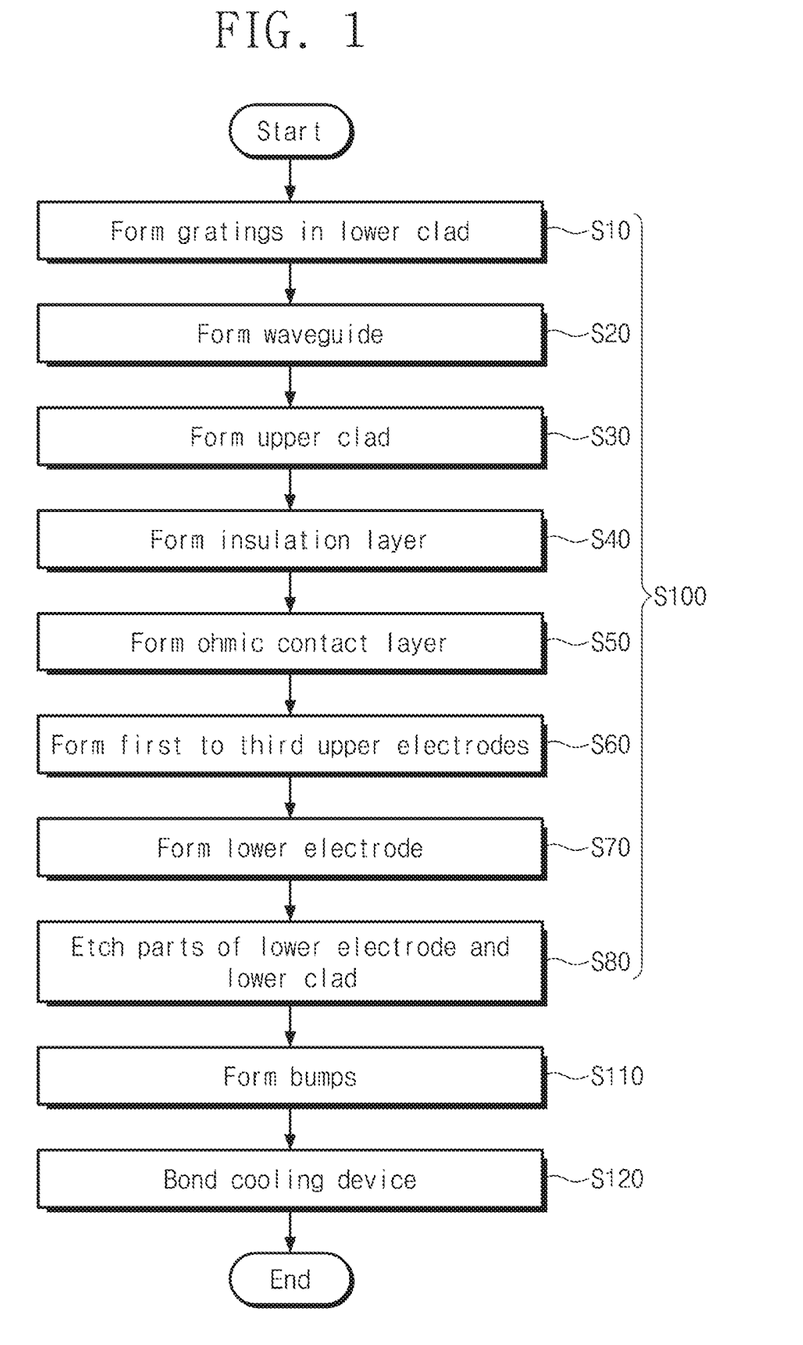
FIG. 1 is a flowchart showing a manufacturing method of an optical apparatus according to an embodiment of the inventive concept.

FIG. 1 is a flowchart showing a manufacturing method of an optical apparatus according to an embodiment of the inventive concept.

Referring to FIG. 1, a manufacturing method of an optical apparatus may include a step S100 of providing a distributed Bragg reflector (DBR) laser diode, a step S110 of forming bumps, and a step S120 of bonding a cooling device. According to an example, the step S100 of forming the DBR may include a step S10 of forming gratings in a lower clad, a step S20 of forming a waveguide, a step S30 of forming an upper clad, a step S40 of forming an insulation layer, a step S50 of forming an Ohmic contact layer, a step S60 of forming first to third upper electrodes, a step S70 of forming a lower electrode, and a step S80 of etching a part of the lower electrode and a part of the lower clad.

FIGS. 2 to 11 are process cross-sectional views showing an example of the step S100 of forming the distributed Bragg reflector (DBR) laser diode of FIG. 1.

Figure 2:
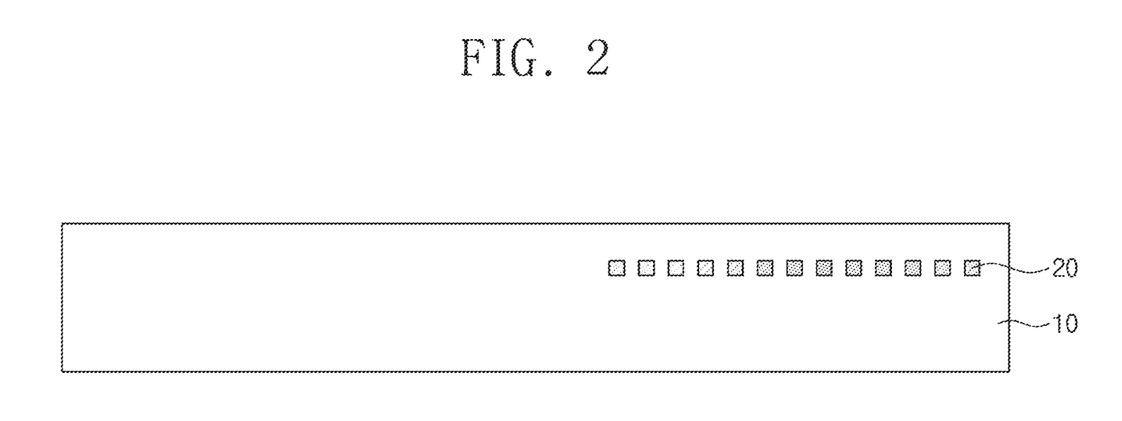
FIGS. 2 to 11 are process cross-sectional views showing an example of a step in which the distributed Bragg reflector (DBR) laser diode of FIG. 1 is formed.

Referring to FIGS. 1 and 2, the gratings 20 are formed in the lower clad 10 (step S10). According to an example, the lower clad 10 may include III-V compound semiconductor or II-VI compound semiconductor. The lower clad 10 may include N-type InP. According to an example, the gratings 20 may include Bragg gratings.

Figure 3:
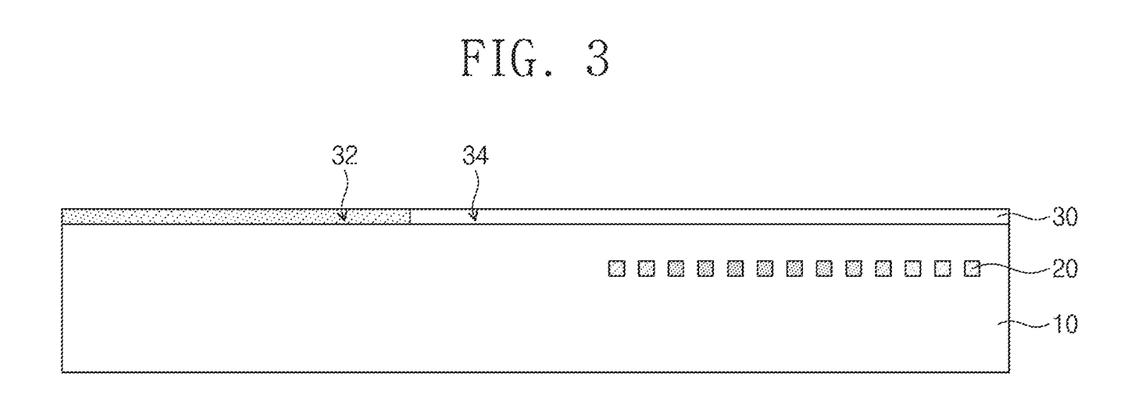

Referring to FIGS. 1 and 3, the waveguide 20 is formed on the lower clad 10 (step S20). For example, the waveguide 20 may include intrinsic InGaAsP or InGaAs. The waveguide 30 may have the thickness of about 0.35 μm. According to an example, the waveguide 30 may include an active waveguide 32 and a passive waveguide 34. For example, the active waveguide 32 may have a multiple quantum well (MQW) structure. The active waveguide 32 may provide the gain of a laser light 101. The active waveguide 32 may have a gain medium (not shown). The gain medium may include InGaAs or InGaAsP. The passive waveguide 34 may be formed on the gratings 20. The gratings 20 may reflect and/or generate the laser light 101. In other words, the active waveguide 32 may generate a light of a wide spectrum band and the gratings may reflect the light of a specific wavelength to generate an oscillation light. The waveguide 32 and the gratings 20 may function as a resonator. The gratings 20 may satisfy a Bragg condition $m\lambda=2n_{eq}\Lambda$, where m is an order of diffraction of 1, $\lambda$, is a wavelength of a light, $n_{eq}$ is an effective refractive index of a guiding layer, and $\Lambda$ is a period of a refractive grating.

Figure 4:
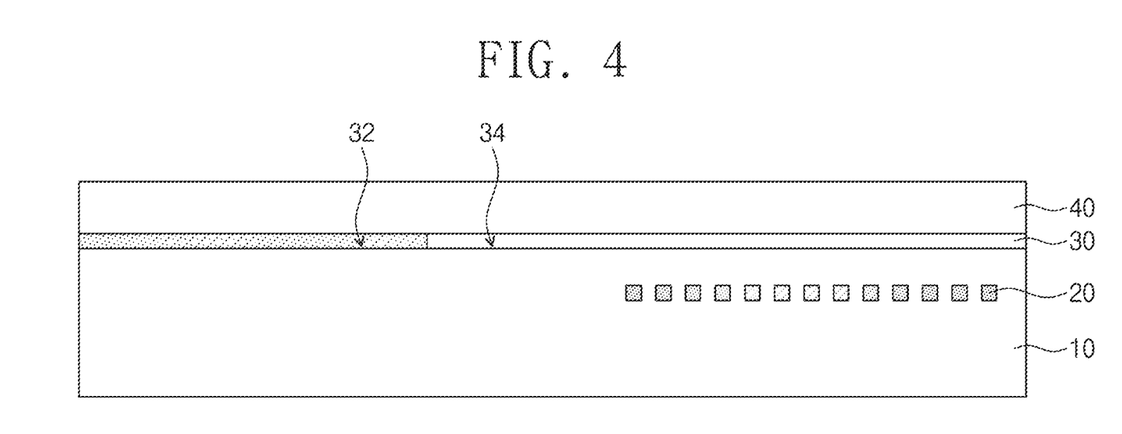

Referring to FIGS. 1 and 4, the upper clad 40 is formed on the waveguide 30 and a current blocking layer 12 (step S30). For example, the upper clad 40 may include P-type InP.

Figure 5:
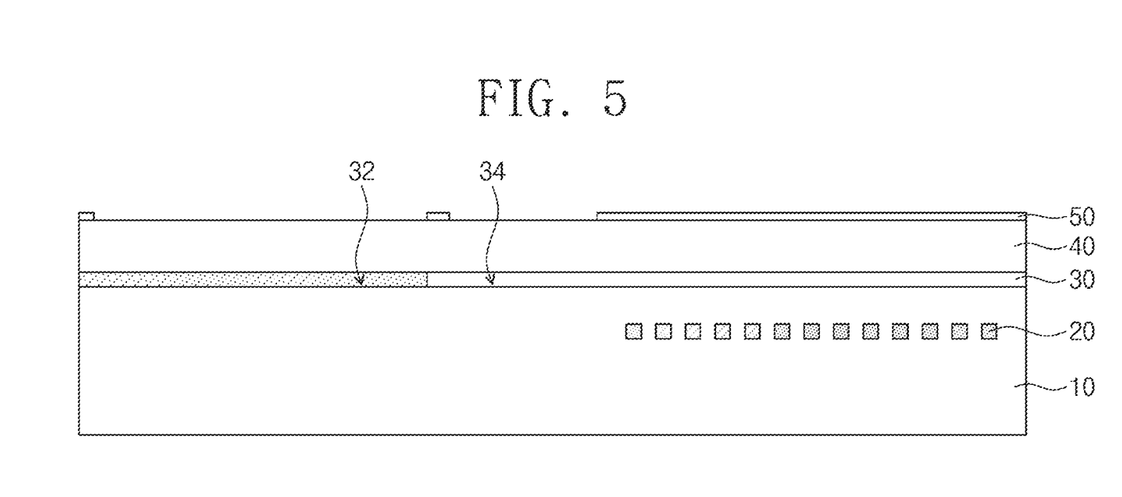

Referring to FIGS. 1 and 5, the insulation layer 50 may be formed on the upper clad 40. The insulation layer 50 may be formed by a deposition process, a photolithography process and an etching process. According to an example, the insulation layer 50 may be formed on a passive waveguide 34. The insulation layer 50 may include a dielectric material. For example, the insulation layer 50 may include a silicon oxide or a silicon nitride. The insulation layer 50 may have the thickness of about 100 nm to about 200 nm.

Figure 6:
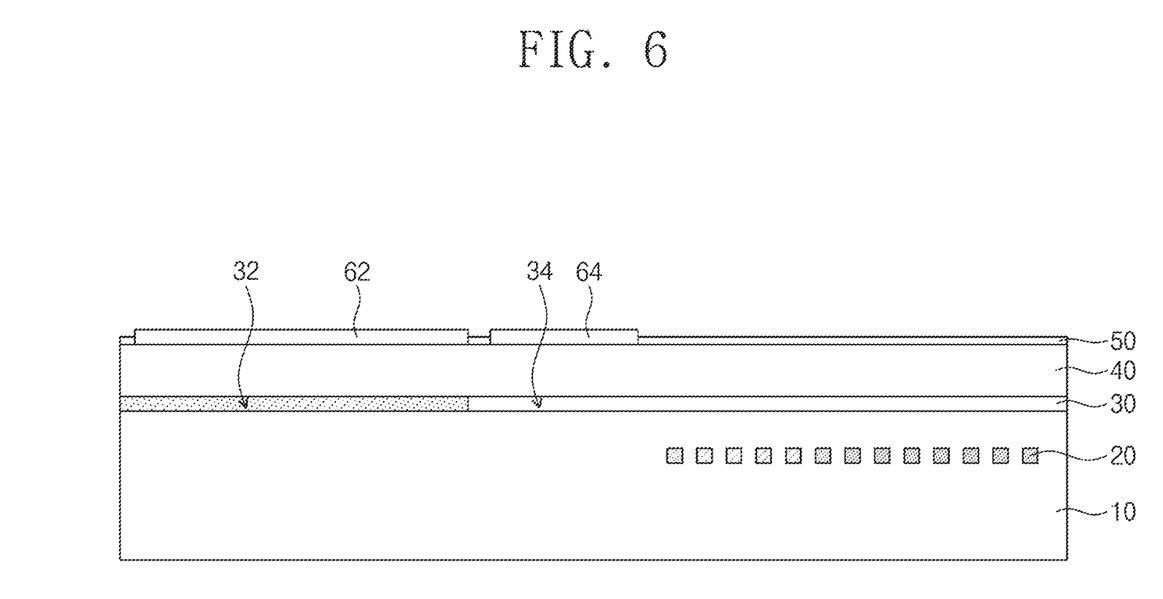

Referring to FIGS. 1 and 6, first and second Ohmic contact layers 62 and 64 on the upper clad 40 exposed from the insulation layer 50 (step S50). The first and second Ohm contact layers 62 and 64 may be formed on the upper clad 40 of the active waveguide 32 and the passive waveguide 40.

The first and second Ohm contact layers 62 and 64 may be formed on the upper clad 40 outskirts of the gratings 20. The first and second Ohmic contact layers 62 and 64 may include P-type GaAs or InGaAs.

Figure 7:
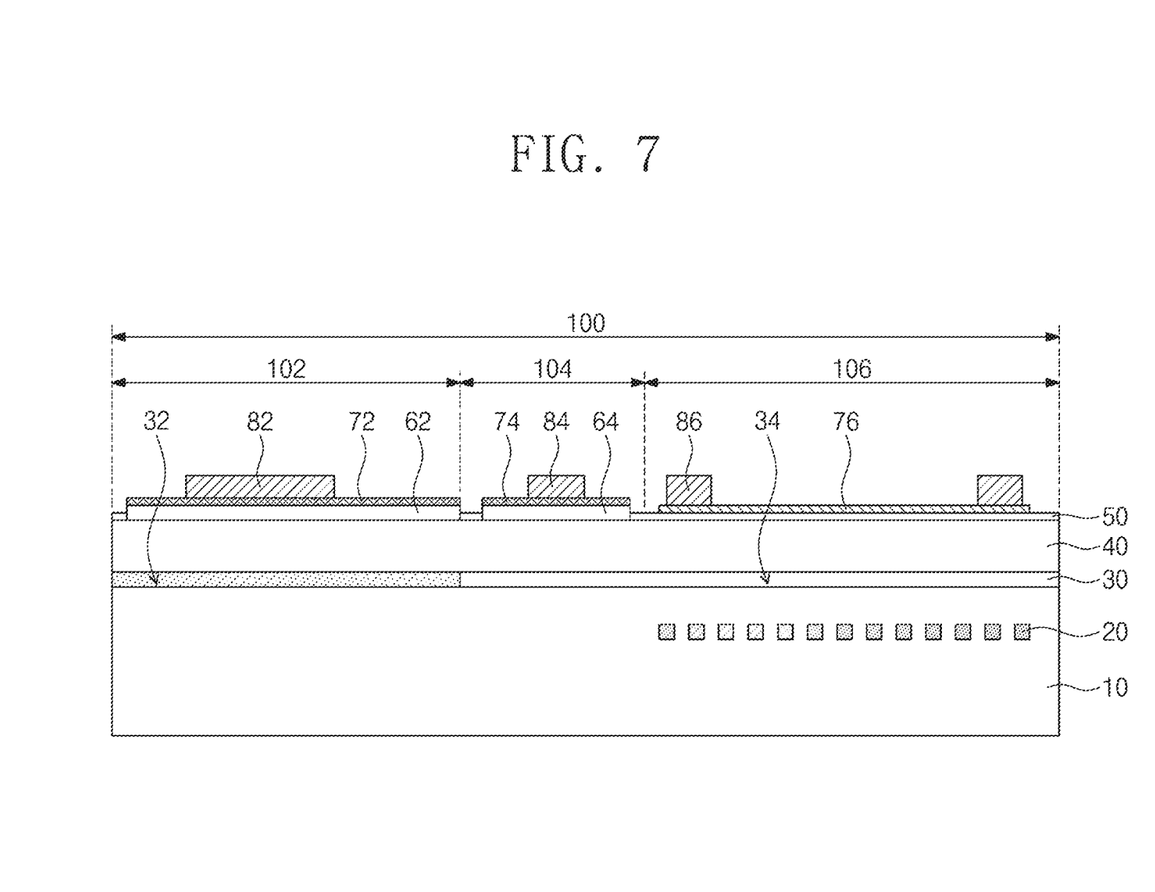
Figure 12:
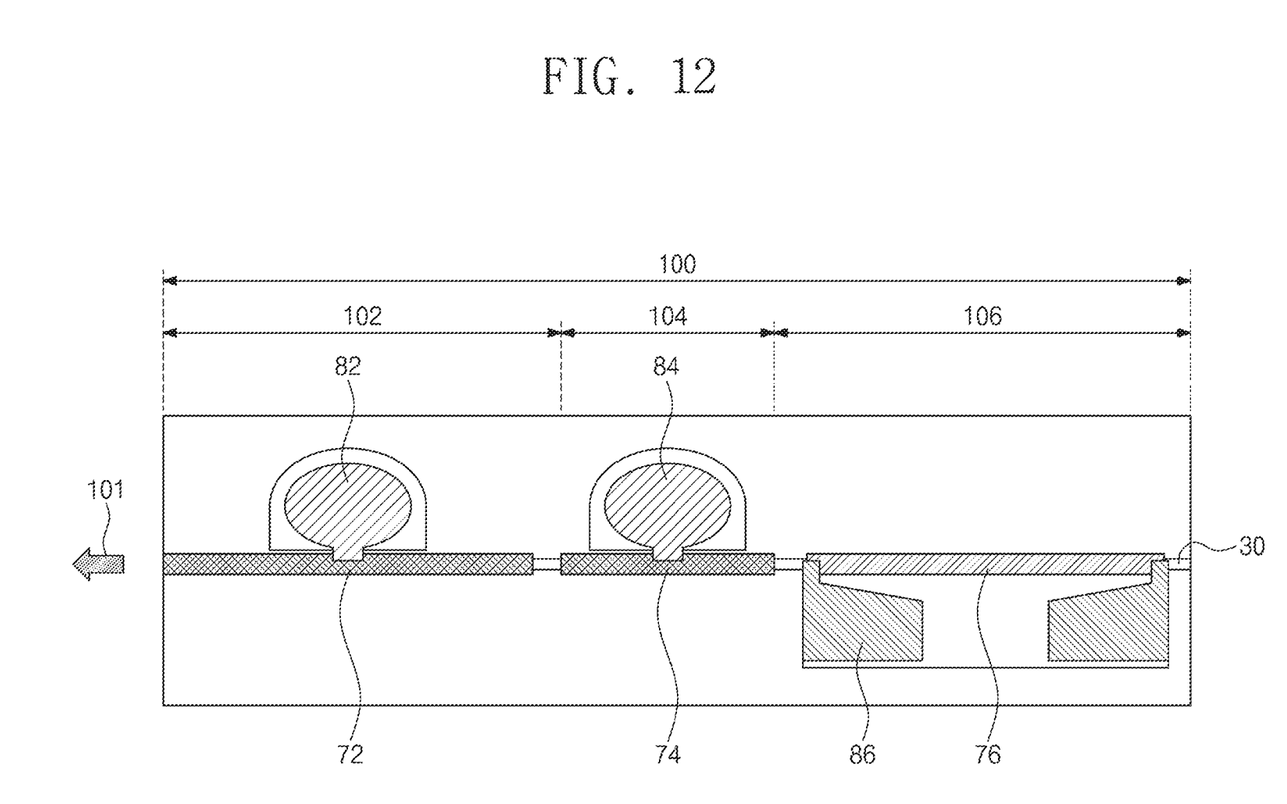
FIG. 12 is a plan view of first to third upper electrodes of FIG. 7.

FIG. 12 is a plan view of first to third upper electrodes 72, 74 and 76 of FIG. 7.

Referring to FIGS. 1, 7, and 12, the first to third upper electrodes 72, 74 and 76 are formed on the first and second Ohmic contact layers 62 and 64 and the insulation layer 50 (step S60). Each of the first to third upper electrodes 72, 74 and 76 may be formed through a metal disposition process, a photolithography process and an etching process.

The first and second upper electrodes 72 and 74 may be formed on the first and second Ohmic contact layers 62 and 64. For example, the first and second upper electrodes 72 and 74 may include at least one of gold, silver, aluminum, platinum, tungsten, titanium, tantalum, molybdenum, indium, nickel, chromium, or manganese. The first and second upper electrodes 72 and 74 may be first and second current injection electrodes. For example, a first current is provided to the first upper electrode 72, the active waveguide 32 may generate the laser light 101. The first upper electrode 72 and/or the active waveguide 32 may define a gain section 102.

The laser light 101 may travel along the passive waveguide 34. Wavelength tunable characteristics of the laser light 101 may be obtained by jumping an interval corresponding to a free spectral range (FSR) of a resonator according to first and second currents and thermal heating. The laser light 101 may have an oscillation wavelength of a wavelength located between the FSR intervals or may be obtained in a single mode with a high side-mode suppression ratio (SMSR) equal to or greater than about 30 dB near a selected wavelength. The single mode with the high SMSR may be obtained by adjusting a cavity mode induced through current injection or thermal heating in a phase section 104.

Figure 9:
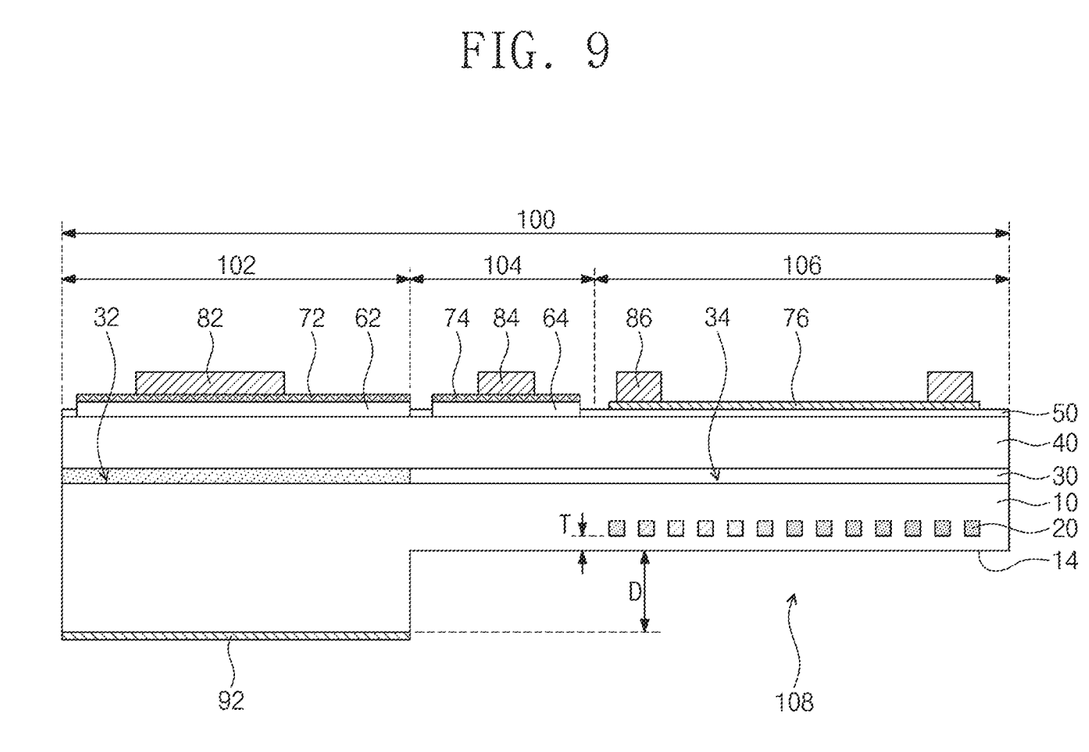

The lower clad 10 may be grounded by the lower electrode 92 (see FIG. 9). When the second current is provided to the second upper electrode 74, the cavity mode of the laser light 101 in the passive waveguide 34 may be adjusted. The cavity mode of the laser light 101 may be adjusted by heating the second upper electrode 74. The second upper electrode 74 may define the phase section 104.

The third upper electrode 76 may be formed on the insulation layer 50. The third upper electrode 76 may be disposed on the gratings 20. The third upper electrodes 76 may be heater electrodes. For example, the third upper electrode 76 may include a nickel-chromium alloy. The third upper electrode 76 may heat the upper clad 40, the passive waveguide 34, the lower clad 10 and the gratings 20 of the wavelength tunable section. Refractive indexes of the heated upper clad 40, passive waveguide 34, lower clad 10 and gratings 20 may vary. For example, when the heated upper clad 40, the passive waveguide 34, the lower clad 10 and the gratings 20 are heated, the refractive indexes thereof may increase. The wavelength of the laser light 101 may be changed in correspondence to a Bragg condition change of the gratings 20. According to an embodiment, when the refractive index increases, the wavelength of the laser light 101 may increase. Accordingly, when a temperature increases, the wavelength of the laser light 101 may increase. A temperature of the third upper electrode 76 may be proportional to the wavelength of the laser light 101. The third upper electrode 76 may define the wavelength tunable section 106. The DBR laser diode 100 may include the gain section 102, the phase section 104, and the wavelength tunable section 106.

Thereafter, first to third pads 82, 84 and 86 may be formed on the first to third upper electrodes 72, 74 and 76. The first to third pads 82, 84 and 86 may include a metal identical to that of the first to third upper electrodes 72, 74 and 76. The first and second Ohmic contact layers 62 and 64, the first and second upper electrodes 72 and 74, and the first and second pads 82 and 74 may have a laminated structure of Ti/Pt/Au. The third upper electrode 76 and the third pad 86 may have a laminated structure of Cr/Au.

Figure 8:
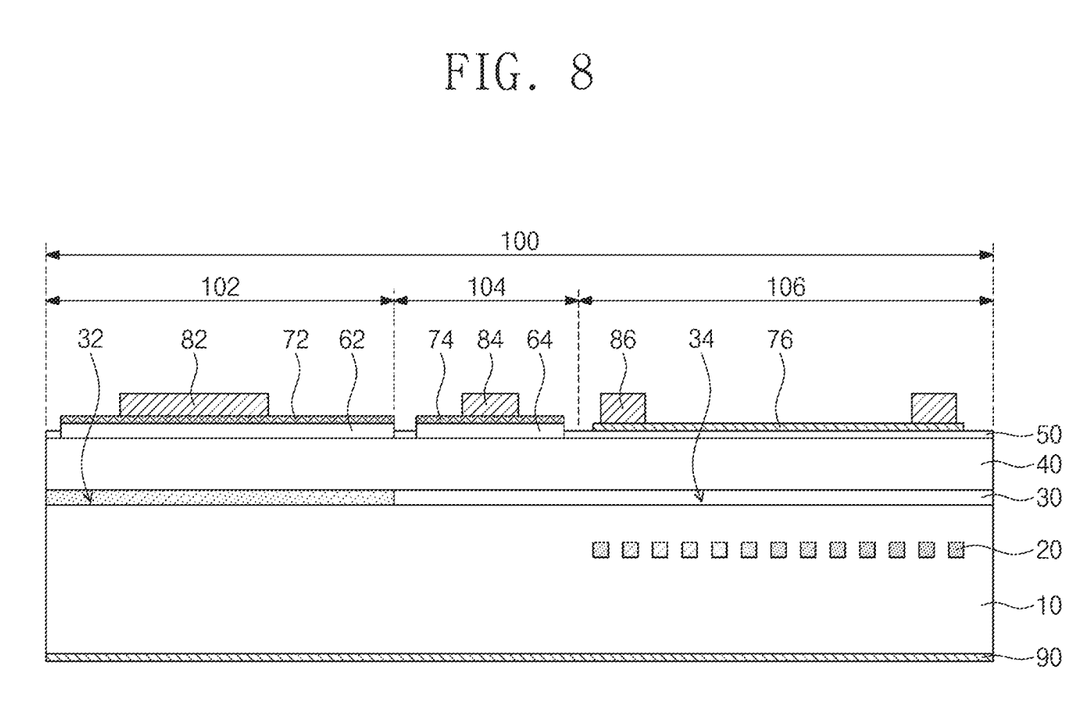

Referring to FIGS. 1 and 8, a lower electrode layer 90 is provided under the lower clad 10 (step S70). The lower electrode layer 90 may be formed by a metal deposition process. The lower electrode layer 90 may be formed on and/or under a front surface of the lower clad 10. For example, the lower electrode layer 90 may include a metal having the thickness of about 100 μm to about 200 μm.

Referring to FIGS. 1 and 9, a part of the lower electrode layer 90 and a part of the lower clad 10 are etched to provide a lower electrode 92 and a recess region 108 (step S80). The lower electrode 92 may be formed under the lower clad 10 of the gain section 102. The recess region 108 may be formed in the phase section 104 and the wavelength tunable section 106 by etching the lower clad 10. The recess region 108 may be formed by a photolithography process and an etching process. The recess region 108 may be formed in the lower clad 10 under the passive waveguide 34. Although not illustrated, the lower electrode 92 may be formed by a wrapping process and/or a liftoff process.

Figure 13:
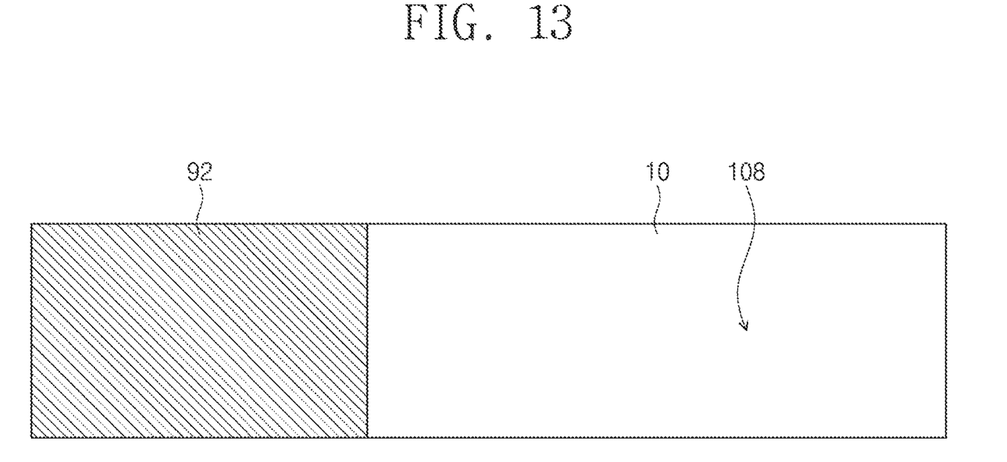
FIG. 13 is a plan view showing a lower electrode and a lower clad in a recess region of FIG. 9.

FIG. 13 shows the lower electrode 92 and the lower clad 10 inside the recess region 108 of FIG. 9.

Referring to FIGS. 9 and 13, the lower electrode 92 may formed adjacent to the recess region 108. The recess region 108 may expose, to the air, a bottom surface 14 of the lower clad 10 of the phase section 104 and the wavelength tunable section 106. For example, the lower clad 10 inside the recess region 108 may have the thickness of 3 μm to 5 μm from the gratings 20 to the bottom surface 14. In other words, the gratings 20 may be formed in the depth of 3 μm to 5 μm or deeper from the bottom surface 14 of the lower clad. 10. When the lower clad 10 has the thickness of about 100 μm, the recess region 108 may be formed in the depth D and/or the height of about 10 μm to about 80 μm. The depth D of the recess region 108 may be determined such that a thermal efficiency of the upper clad 40 of the third upper electrode 76 is balanced with a thermal isolation efficiency of the lower clad 10.

Figure 14:
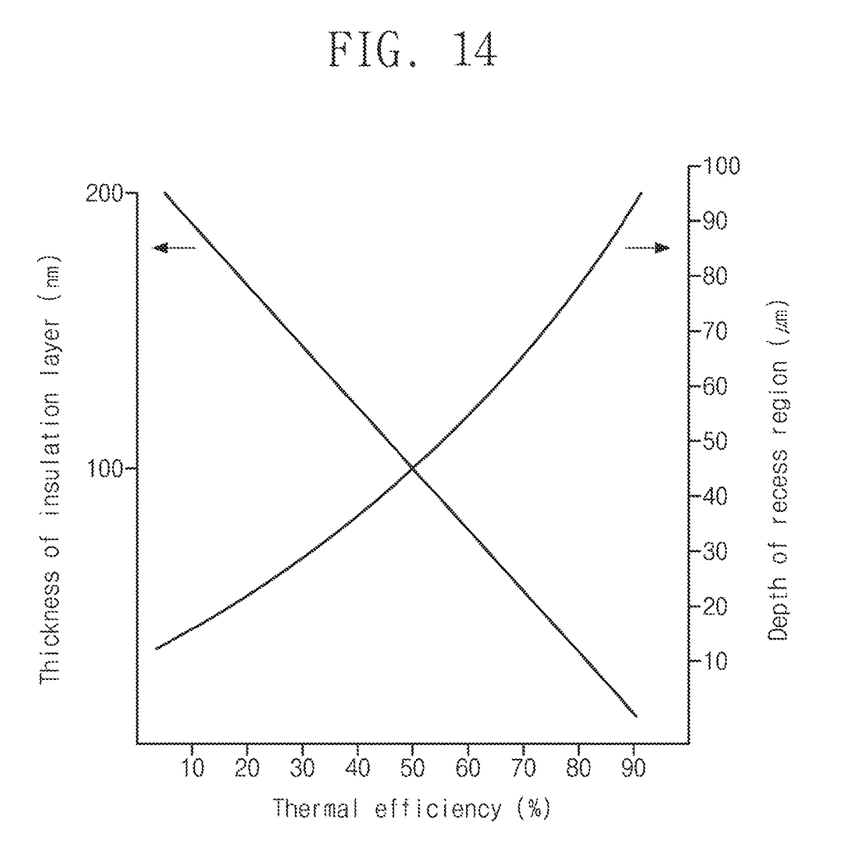
FIG. 14 is a graph showing the thickness of an insulation layer and the depth of the recess region according to thermal efficiencies of an upper clad and the lower clad of FIG. 9.

FIG. 14 is a graph showing the thickness T of the insulation layer 50 and the depth D of the recess region 108 according to the thermal efficiencies of the upper clad 40 and the lower clad 10 in FIG. 9.

Referring to FIG. 14, when the thickness of the insulation layer 50 is about 100 nm and the depth of the recess region 108 is about 45 μm, a thermal efficiency of heat transfer or thermal isolation of the upper clad 40 and the lower clad 10 may be 50%. When the thermal efficiency is lower than 50%, the thermal transfer efficiency may be smaller than the thermal isolation efficiency. The lower clad 10 having the recess region 108 in the depth smaller than about 45 μm may be excessively heated in comparison to the insulation layer 50 having the thickness of about 100 μm. When the thermal efficiency is higher than 50%, the thermal isolation efficiency may be lower than the thermal transfer efficiency. The lower clad 10 having the recess region 108 in the depth larger than about 45 μm may be excessively cooled in comparison to the insulation layer 50 having the thickness of about 100 μm.

Figure 15:
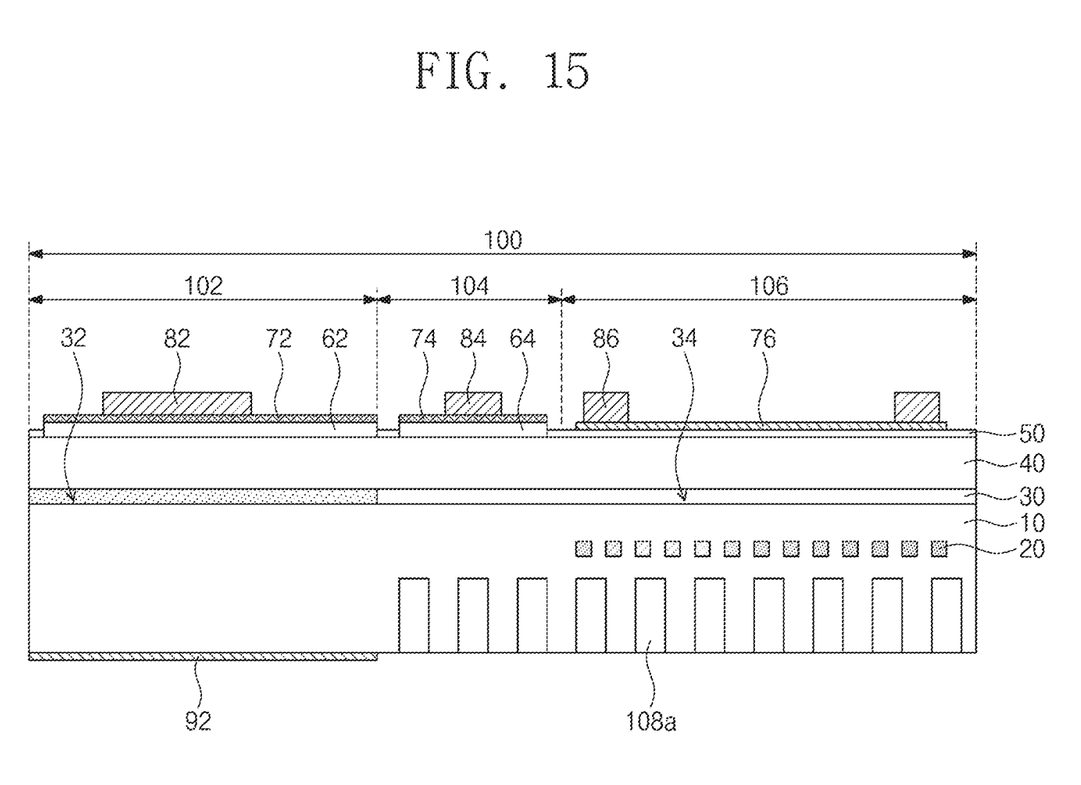
FIGS. 15 and 16 are respectively a cross-sectional view and a plan view showing an example of the recess region of FIG. 9.
Figure 16:
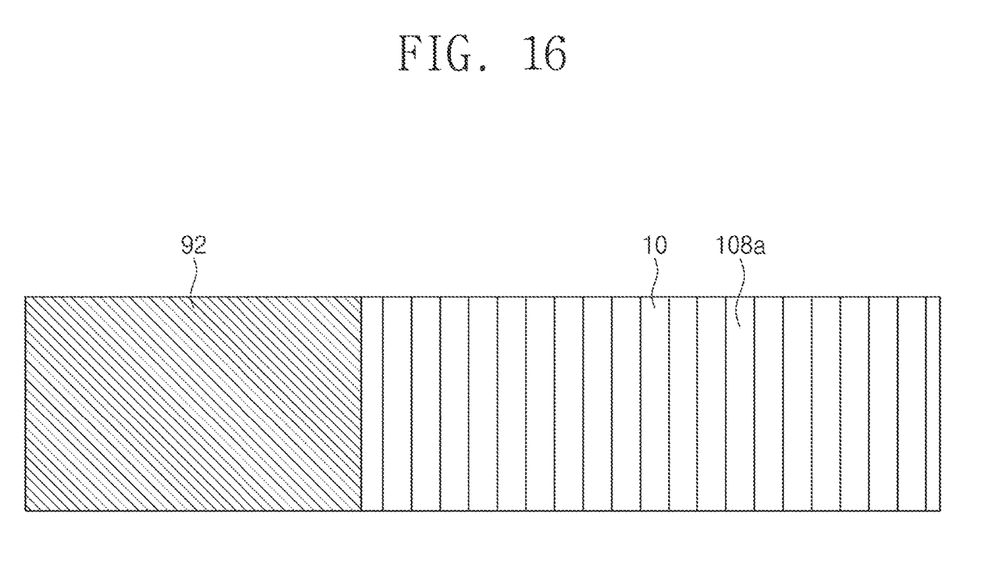

FIGS. 15 and 16 show examples of the recess region of FIG. 9.

Referring to FIGS. 15 and 16, recess regions 108*a* may include trenches. Each of the recess regions 108*a* may be parallel with each other. For example, the recess regions 108*a* may have a line shape. When the gain section 102 has the length of about 200 μm to about 500 μm and the wavelength tunable section 106 has the length within about 500 μm, each of the recess regions 108*a* may have the width and/or an interval of about 10 μm to about 100 μm.

Figure 17:
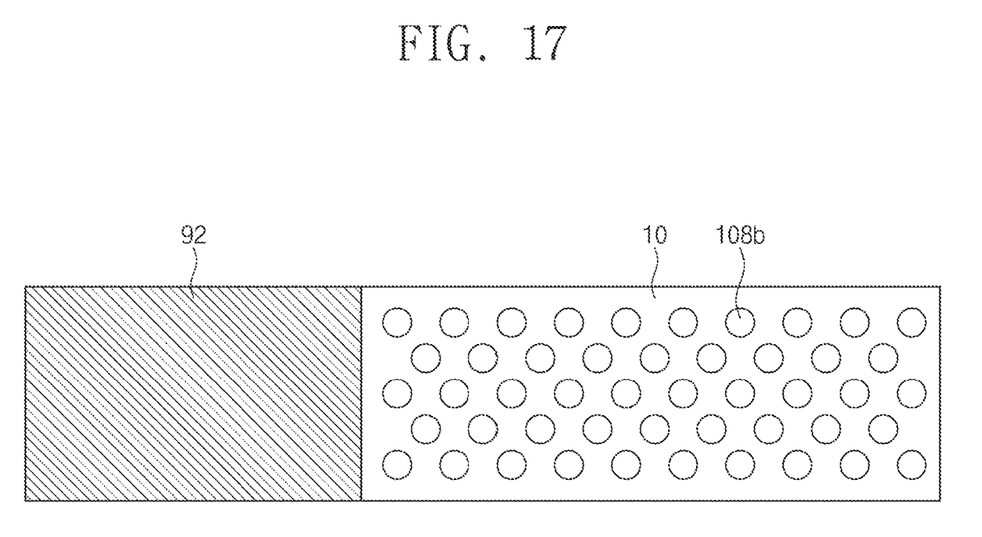
FIG. 17 is a plan view showing an example of the recess regions of FIG. 15.

FIG. 17 shows an example of the recess regions of FIG. 15.

Referring to FIG. 17, the recess regions 108*b* may include holes. For example, each of the recess regions 108*b* may have a radius of several μm to dozens μm. The recess regions 108*b* may be locally formed in the lower clad 10 of the phase section 104 and the wavelength tunable section 106. The recess regions 108*a* may be arranged in a honeycomb shape.

Figure 10:
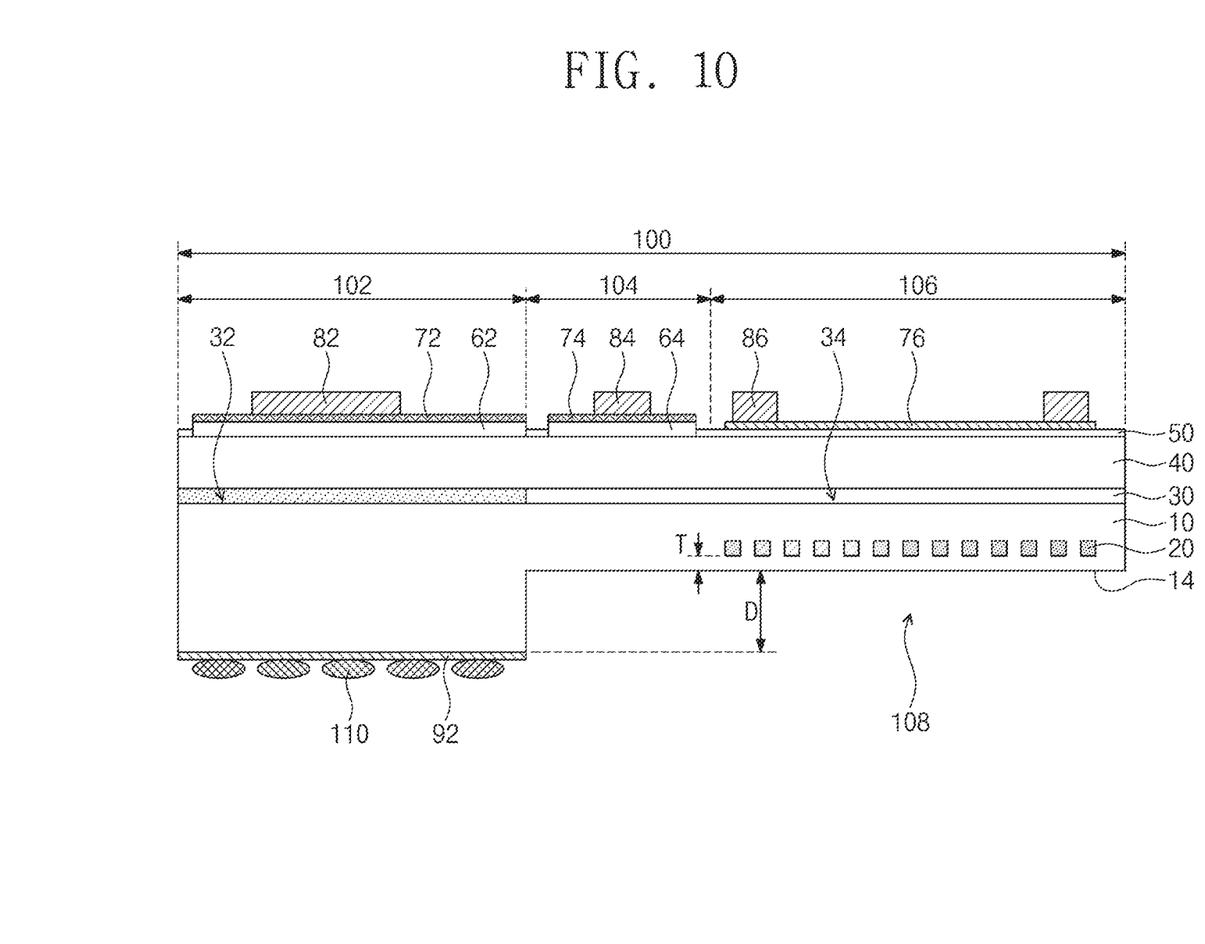

Referring to FIGS. 1 and 10, bumps 110 may be provided under the lower electrode 92 (step S110). The bumps 110 may be connected to the lower electrode 92. The bumps 110 may include solders.

Figure 11:
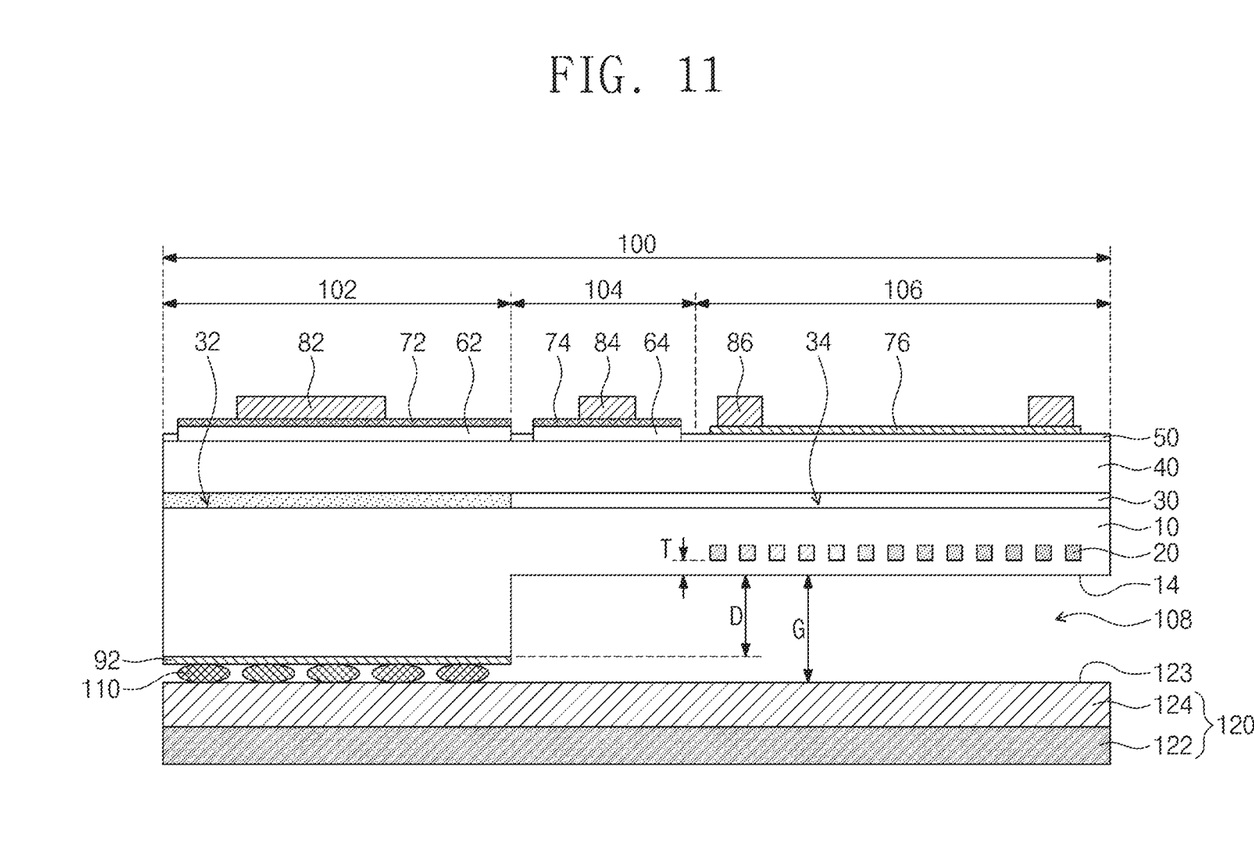

Referring to FIGS. 1 and 11, a cooling device 120 is attached to the bumps 110 (step S110). The cooling device 120 may include a thermo-electric element. The cooling device 120 may cool the gain section 102. The cooling device 120 may include a thermocouple 122 and a metal optical bench (MOB) 124. The MOB 124 may be disposed between the bumps 110 and the thermocouple 122. The MOB 124 may include aluminum, tungsten, tantalum, titanium, or stainless steel. The thermocouple 122 may cool the MOB 124, the bumps 110 and the gain section 102 using a Peltier effect.

According to an example, a top surface 123 of the MOB 124 and a bottom surface 14 of the lower clad 10 in the phase section 104 and the wavelength tunable section 106 may form an air gap G. The air gap G may include the recess region 108. The air gap G may be larger than the depth of the recess region 108. According to an example, the air gap G may be defined by the bottom surface 14 of the lower clad 10 in the recess region 108 and the top surface 123 of the cooling device 120. The air gap G may thermally separate and/or delink the wavelength tunable section 106 and/or the phase section 104 from the cooling device 120. For example, the air in the air gap G may be used as a heat insulating material of the wavelength tunable section 106 and the cooling device 120. The air in recess region 108 may be used as a heat insulating material of the phase section 104 and the cooling device 120. The recess region 108 may reduce an interference between heating of the wavelength tunable section 106 and cooling of the cooling device 120.

Figure 18:
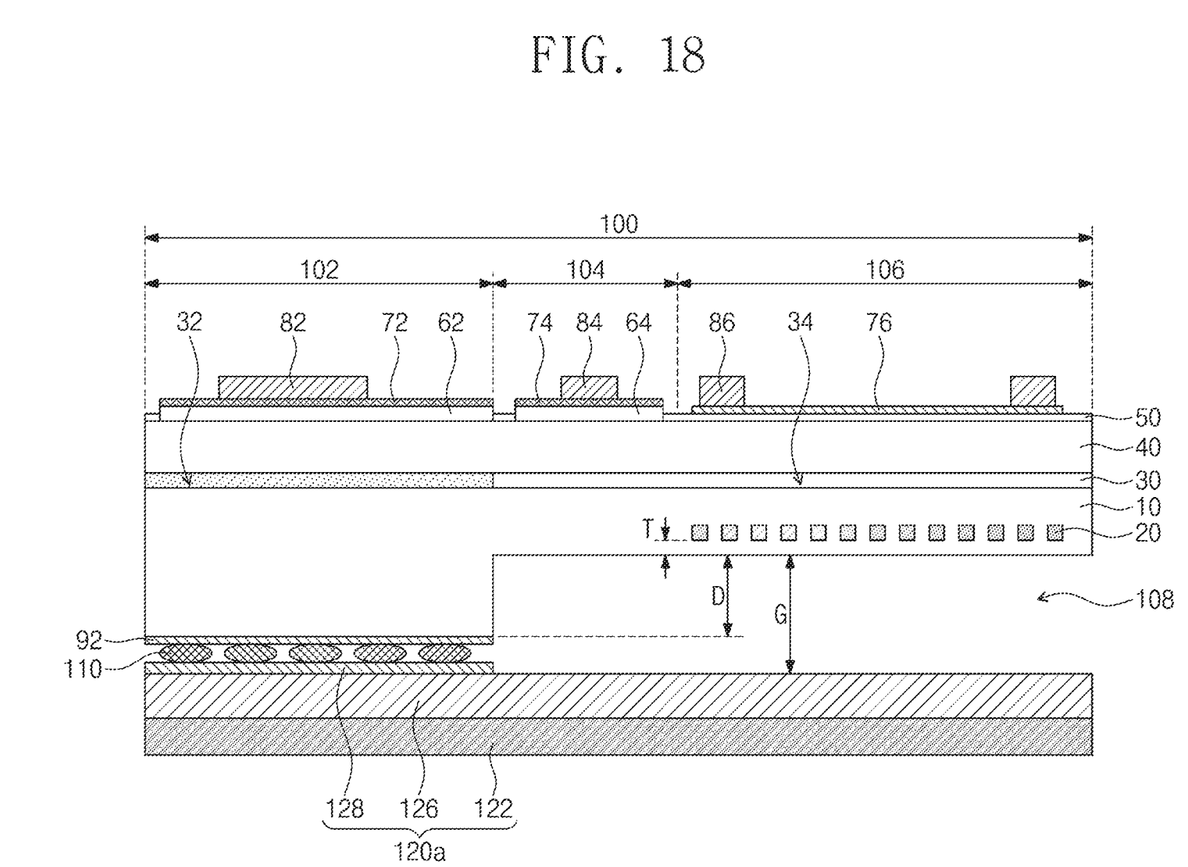
FIG. 18 is a plan view showing an example of a cooling device of FIG. 11.

FIG. 18 shows an example of the cooling device of FIG. 12.

Referring to FIG. 18, the cooling device 120*a* may include a mount block 126 and a metal pattern 128 between the bumps 110 and the thermocouple 122. The mount block 126 may electrically insulate the metal pattern 128 from the thermocouple 122. Unlike this, the mount block 126 may have a lower thermal conductivity than a metal. The mount block 126 may thermally separate and/or delink the bumps 110 from the thermocouple 122. The mount block 126 may include a ceramic. The metal pattern 128 may be formed between the bumps 110 and the mount block 126. The bumps 110 may be bonded on the metal pattern 128. The metal pattern 128 may be grounded externally. Unlike this, the metal pattern 128 may be connected to an external power source.

As described above, a distributed Bragg reflector laser diode according to embodiments of the inventive concept may provide a recess region by etching a part of a lower clad. The air in the recess region may function as a heat insulating material of a lower clad in a wavelength tunable section and a cooling device below the lower clad. The recess region may reduce an interference between heating of the wavelength tunable section and cooling of the cooling device.

The foregoing description is about detailed examples for practicing the inventive concept. An exemplary embodimentbond includes not only the above-described embodiments but also simply changed or easily modified embodiments. In addition, the inventive concept may also include technologies for easily modifying and practicing the above-described embodiments.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An optical apparatus, comprising:
   a cooling device;
   a lower clad disposed on the cooling device;
   a waveguide disposed on the lower clad, the waveguide including an active waveguide to define a gain section on the lower clad and a passive waveguide connected to the active waveguide to define a wavelength-tunable section adjacent to the gain section on the lower clad;
   gratings disposed in the lower clad of the wavelength-tunable section;
   an upper clad disposed on the waveguide;
   a first upper electrode disposed on the upper clad of the gain section; and
   a second upper electrode disposed on the upper clad of the wavelength-tunable section,
   wherein the lower clad of the gain section has a thickness of 100 μm,
   wherein the lower clad of the wavelength-tunable section has a recess region to expose an upper surface of the cooling device, the recess region forming an air gap having a height of 10 μm to 80 μm from the upper surface of the cooling device, and
   wherein the gratings are formed in a depth equal to or greater than 5 μm from a bottom surface of the lower clad of the recess region.

2. The optical apparatus of claim 1, further comprising:
   bumps disposed between the lower clad of the gain section and the cooling device,
   wherein the cooling device comprises:
   a thermocouple; and
   a metal optical bench disposed between the thermocouple and the bumps.

3. The optical apparatus of claim 1, further comprising:
   bumps disposed between the lower clad of the gain section and the cooling device,
   wherein the cooling device comprises:
   a thermocouple;
   a mount block disposed between the thermocouple and the bumps; and
   a metal pattern formed between the mount block and the bumps, the metal pattern being grounded.

* * * * *